United States Patent [19]

Kawai et al.

[11] Patent Number: 5,408,476
[45] Date of Patent: Apr. 18, 1995

[54] ONE BIT ERROR CORRECTION METHOD HAVING ACTUAL DATA REPRODUCTION FUNCTION

[75] Inventors: Masaaki Kawai; Masayoshi Sekido; Yuji Takizawa; Hidetoshi Naito; Satomi Ikeda; Kazuyuki Tajima; Haruo Yamashita, all of Kawasaki; Hideo Tatsuno, Yokosuka, all of Japan

[73] Assignees: Fujitsu Limited, Kanagawa; Nippon Telegraph and Telephone Corporation, Tokyo, both of Japan

[21] Appl. No.: 16,871

[22] Filed: Feb. 11, 1993

[30] Foreign Application Priority Data

Feb. 13, 1992 [JP] Japan .................................. 4-058768

[51] Int. Cl.⁶ ............................................. G06F 11/10
[52] U.S. Cl. ...................................... 371/37.1; 371/37.7
[58] Field of Search ................. 371/37.1, 37.7; 375/26

[56] References Cited

U.S. PATENT DOCUMENTS

| | | | |
|---|---|---|---|
| 4,468,770 | 8/1984 | Metcalf et al. | 371/37.1 |
| 4,928,280 | 5/1990 | Nielson et al. | 371/39.1 |
| 5,062,111 | 10/1991 | Gotou et al. | 371/37.1 |

Primary Examiner—Paul Gordon

[57] ABSTRACT

A 1-bit error correction circuit based on CRC calculation is provided with a syndrome generation circuit which determines input parallel data of m bits and which have been converted from n number of m-bit serial data. A 1-bit error detection circuit cyclically supplies a syndrome to a remainder calculation circuit and decodes remainder data obtained from this cyclic supply and detects 1-bit errors. A actual data reproduction circuit calculates the exclusive OR of output data of a predetermined register of a 1'st~n'th register of a syndrome generation circuit and data supplied to a predetermined register and obtains parallel data which is the actual data. A correction circuit which calculates a exclusive OR of parallel data obtained from a actual data reproduction circuit and 1-bit error data detected by the 1-bit error detection circuit and outputs corrected data.

6 Claims, 11 Drawing Sheets

FIG. 3 PRIOR ART

| TIME | OUTPUT OF SHIFT REGISTER 13 | INPUT OF SHIFT REGISTER 19 |
|---|---|---|
| t0 | C | |
| t1 | $H1 \oplus f(C)$ | |
| t2 | $H2 \oplus f(H1) \oplus f^2(C)$ | |
| t3 | $H3 \oplus f(H2) \oplus f^2(H1) \oplus f^3(C)$ | |
| t4 | $H4 \oplus f(H3) \oplus f^2(H2) \oplus f^3(H1) \oplus f^4(C)$ | C |
| t5 | $H5 \oplus f(H4) \oplus f^2(H3) \oplus f^3(H2) \oplus f^4(H1) \oplus f^5(C)$ | $H1 \oplus f(C)$ |

FIG.4 PRIOR ART $$S = [H5] \oplus [\alpha]^2 \cdot [H4] \oplus [\alpha]^2 \cdot [H3] \oplus [\alpha]^3 \cdot [H2] \oplus [\alpha]^4 \cdot [H1] = [\circ \cdots \circ] \cdots ①$$

$$= [H5] \oplus [\alpha]^2 \cdot [H4] \oplus [\alpha]^2 \cdot [H3] \oplus [\alpha]^3 \cdot [H2] \oplus [\alpha]^4 \cdot [H1] \oplus [-\circ---\circ] \cdots ②$$

$$= [\alpha]^4 \oplus [\circ \cdots \circ]$$

$$= [\alpha]^4 \cdot [-\circ---\circ] \cdots ②'$$

FIG. 7

$$S = [H5 \oplus \alpha \cdot H4 \oplus \{\circ - - \circ\} \oplus \alpha^2 \cdot H3 \oplus \alpha^3 \cdot H2 \oplus \alpha^4 \cdot H1] - - - ③$$

$$= [\oplus \alpha \cdot \{\circ - - \circ\}] - - - ③$$
$$[\oplus \{\circ \cdots \circ\}]$$

$$\alpha^3 \cdot (S) = [\alpha^3 \cdot \{\circ \cdots \circ\} \oplus \alpha^3 \cdot \{\circ - - \circ\} = \alpha^4 \cdot \{\circ - - \circ\}] - - - ④$$

ONE BIT ERROR DETECTION PORTION

ONE BIT ERROR CORRECTION METHOD HAVING ACTUAL DATA REPRODUCTION FUNCTION

BACKGROUND OF THE INVENTION

The present invention relates to a 1-bit error correction circuit based on cyclic redundancy check (CRC) calculation, and more particularly, to such a 1-bit error correction circuit which is applicable to apparatus which perform digital multiplexing communications. For example, a 1-bit error correction circuit appends a cyclic code as monitoring control data each time multi-frame data is sent and received between apparatus, and is used when the detection and correction of coding errors is performed.

The actual circuit of a 1-bit error correction circuit becomes larger as the number of data bits handled grows and this is in conflict with recent needs for more compact apparatus. It is therefore required to have a 1-bit error correction circuit which has a small circuit size.

FIG. 1 is a view showing the block constitution of a 1-bit error correction circuit using conventional CRC calculations.

The 1-bit error correction circuit uses the cancellation type remainder generation method. In FIG. 1 inside the dotted line 11 is an 8-bit parallel development cancellation type remainder generation portion.

As shown in FIG. 2A, the input data to this 1-bit error correction circuit is the cyclic code H comprising the 32-bit information portion H1~H4 and the 8-bit check portion H5, and here, the 40 bits of H1~H5 are handled as single frame.

When the cyclic signal H which is the input data is input to the 1-bit error correction circuit shown in FIG. 1, input data H1~H5 are successively and respectively input in 8-bit parallel H1~H5 to the 1-bit error correction circuit. FIG. 2A shows the cyclic signal which is the input data. The cyclic signal H is comprised from the information portion H1~H4, and the check portion H5, and one frame has a total of 40 bits.

FIG. 2B shows 1 byte (H4) of the cyclic signal, and is the contents of the code H4 of the information portion of the cyclic signal H. FIG. 2B shows the case for when the 7th of the 8 bits is an error.

The cancellation type remainder generation portion 11 (syndrome generation portion) for 8-bits parallel development is comprised of the exclusive OR circuits (EOR) 12,21, a shift register (SR) 13, a first remainder calculation circuit 14, shift register 15~19, and a second remainder calculation circuit (EOR) 20.

The exclusive OR circuit 12 calculates of the exclusive OR of the 8-bit input parallel data and input parallel data other than the 8-bit data, and outputs the result as 8-bit parallel data. In FIG. 1, the exclusive OR circuit 12 performs exclusive OR of the cyclic signal H which is successively input as the input data to H1~H5, and the 8-bit output data of the first remainder calculation circuit 14, and outputs the result to the shift register (SR) 13.

The shift register (SR) 13 is comprised so as to be connected in parallel to eight 1-bit flip flops, stores the input 8-bit data, and outputs the stored 8-bit data.

On the basis of the function $f(x)$, the first remainder calculation circuit 14 performs a remainder calculation on the 8-bit data which is input from the shift register (SR) 13 and the shift register 15.

In FIG. 3, at time $t_0$, the first remainder calculation circuit 14 outputs the remainder $f(C)$ as the initial value C which is the random value output from the shift register (SR) 13. This initial value C is also output to the first remainder calculation circuit 14 and the shift register 15.

At this time, the exclusive OR circuit 12 calculates of the exclusive OR of the remainder $f(C)$ and the H1 which is supplied as the input data, and outputs to the input side of the shift register (SR) 13.

At time $t_1$ when the clock signal from the timing generation circuit (not shown in the figure), is input to the 1-bit error correction circuit, H1 Ex $f(C)$ is output to the shift register (SR) 13. In FIG. 3, H1 $\bigcirc$ $f(C)$ is the exclusive OR of the input data H1 and the remainder $f(C)$. The $\bigcirc$ of "H1s$\bigcirc$f(c)" is expressed as "Ex" in this specification.

The shift register (SR) 13 stores and outputs the exclusive OR H1 Ex $f(C)$ to the first remainder calculation circuit 14 and the shift register 15. The shift register 15 stores C at time $t_1$.

In addition, the first remainder calculation circuit 14 uses the function $f(x)$ and the input exclusive OR of "H1Ex $f(C)$" to output "(H1Ex $f(C)$)=$f$(H1) Ex $f^2$ (C)" to the exclusive OR circuit 12. The exclusive OR circuit 12 uses the "$f$(H1)Ex $f^2$ (C)" which has been input from the first remainder calculation circuit 14, as input data to perform exclusive OR calculation on H2 which is supplied after H1, and outputs that result to the shift register (SR) 13.

At time $t_2$ when the next clock signal is supplied, the shift register (SR) 13 outputs "H2 Ex $f$(H1)Ex $f^2$ (C)" to the first remainder calculation circuit 14 and the shift register 15.

At time $t_2$, the shift register 15 stores the "H1 Ex $f(C)$" which is the output of the shift register (SR) 13 at the time $t_1$, takes the initial value C stored in the shift register 15 at time $t_0$ and shifts it to the shift register 16.

In addition, the first remainder calculation circuit 14 to which is input "H2 Ex $f$(H1)Ex $f^3$ (C)", outputs "$f$(H2)Ex $f^2$ (H1)Ex $f^2$ (C)" to the exclusive OR circuit 12. The exclusive OR circuit 12 calculates the exclusive OR of the "$f$(H2)Ex $f^2$ (H1)Ex $f^3$ (C)" and H3, and outputs that result to the shift register (SR) 13.

At time $t_3$, when there is the input of the clock signal from the timing generation circuit (not shown in the figure) to the 1-bit error correction circuit, the shift register (SR) 13 stores "2Ex $f$(H2)Ex $f^2$ (H1)Ex $f^3$ (C)" and outputs it to the first remainder calculation circuit 14 and the shift register 15.

At this time, the shift register 15 has stored in it the "H2Ex $f$(H1)Ex $f^2$ (C)" which has been output from the shift register (SR) 13 at the time $t_2$, and the "H1 Ex $f(C)$" which has been stored in the shift register 15 at the time $t_2$ is shifted and stored, and intial value C is stored in the shift register 17.

In addition, at time $t_3$, the first remainder calculation circuit 14 to which "H3 Ex $f$(H2)Ex $f^2$ (H1)Ex $f^3$ (C)" has been input, outputs "$f$(H3)Ex $f^2$ (H2)Ex $f^2$ (H1) Ex$f^4$ (C)" to the exclusive OR circuit 12. The exclusive OR circuit 12 calculates the exclusive OR of "H4" and the "$f$(H3)Ex $f^2$ (H2)Ex $f^3$ (H1)Ex $f^4$ (C)", and outputs that result to the shift register (SR) 13.

At time $t_4$ when there is the supply to the 1-bit error correction circuit of the clock signal from the timing generation circuit, the shift register (SR) 13 stores "H4Ex f(H3)Ex f² (H2)Ex f³ (H1)Ex f⁴ (C)" and outputs that to the first remainder calculation circuit 14 and the shift register 15.

At time $t_3$, the shift register 15 stores the "H3Ex f(H2)Ex f² (H1)Ex f³ (C)" which has been output from the shift register (SR) 13.

The shift register 17 stores the shifted "H1 Ex f(C)" at time $t_2$ which is stored in the shift register 16, and at time $t_4$, the shift register 18 stores the C which is stored in the shift register 17.

In addition, at time $t_4$, the first remainder calculation circuit 14 to which "H4Ex f(H3) Ex f² (H2)Ex f³ (H1)Ex f⁴ (C)" was input, output "f(H4) Ex f² (H3) f³ (H2) Ex f⁴ (H1)Ex f⁵ (C)" to the exclusive OR circuit 12. The exclusive OR circuit 12 performs a calculation of the exclusive OR of "H5" and the "f(H4)Ex f² (H3)Ex f³ (H2)Ex f⁴ (H1)Ex f⁵ (C)" and inputs the result to the shift register (SR) 13.

At time $t_5$ when there is the input of the clock signal from the timing generation circuit to the 1-bit error correction circuit, the shift register (SR) 13 stores the "H5 Ex f(H4)Ex f² (H3)Ex f³ (H2)Ex f⁴ (H1)Ex f⁵ (C)" and outputs it to the first remainder calculation circuit 14 and the shift register 15.

At time $t_5$, the shift register 15 stores "H4Ex f(H3)Ex f² (H2)Ex f³ (H1)Ex f⁴ (C)" which is output from shift register 13 at time $t_4$.

The shift register 16 stored the "H4Ex f(H3)Ex f² (H2)Ex f³ (H1)Ex f⁴ (C)" output from the shift register (SR) 13. The shift register 17 stores the "H2 Ex f¹ (H1) Ex f² (C)" which was stored in the shift register 16 at time $t_4$. The shift register 18 stores the "H1Ex f(C)" which was stored in the shift register 17 at time $t_4$. The shift register 19 stores the C which was stored in the shift register 18 at time $t_4$.

This is to say that at time $t_5$, "H1Ex f(C)" is input to the shift register 19 and C is output to the second remainder calculation circuit 20.

On the basis of the function $f^5(x)$, the second remainder calculation circuit 20 performs remainder calculation of the 8-bit data which is input from the shift register 19, and at time $t_5$ when there is the input of C from the shift register 19, outputs $f^5(C)$ to the exclusive OR circuit 21.

At time $t_5$, the "H5Ex f(H4)Ex f² (H3)Ex f³ (H2)Ex f⁴ (H1)Ex f⁵ (C)" which was output from the shift register (SR) 13 is supplied to the other input terminal of the exclusive OR circuit 21 and so the exclusive OR circuit 21 performs a calculation of the exclusive 5 of "f⁵(C)" and "H5Ex f(H4)5 f²(H3)Ex f³(H2)Ex f⁴(H1)Ex f⁵(C)". That result "f⁵(C)" is canceled, and "H5Ex f(H4)Ex f²(H3)Ex f³(H2)Ex f⁴(H1)" is output as the syndrome S for all of H1~H5. More specifically, the second remainder calculation circuit 20 outputs a remainder which includes a random value to the exclusive OR circuit 21 but by canceling the random value, the exclusive OR circuit 21 outputs the syndrome S for all of H1~H5 which is the actual data.

This syndrome S is expressed as shown by equation (①) in FIG. 4 when the function f(x) used in the remainder calculation is expressed in terms of the matrix α(x).

Here, for example, when the 8th bit (bit 7) within the bit 0~bit 7 of H1 has a 1-bit error, expressing the syndrome S in the format of equation (①) gives equation (②) shown in FIG. 4.

At this time, the matrix equation of α, α², α³, α⁴ of equation (②) has a pattern where all of the columns are different and so if the syndrome S expressed by the 40-bit decoder equation (②) corresponding to this pattern is used, then for all of the bits of H1~H5, it is possible to identify where the 1-bit error occurred.

However, one decoder uses an OR gate of the 8-bit type and is of a type where an inverter is added to the input side of those 8 bits, in accordance with the error pattern. When a 1-bit error has occurred in the 8'th bit of the column H1, this is detected by the decoder having the inverter added to the input terminal of the 8'th bit of the OR gate.

The decoder 22 shown in FIG. 1 is comprised of this logic. This is to say that the decoder 22 is comprised of eight-input (8-gates) type OR gates attached to inverters in accordance with the all of the error patterns of H1~H5, and the eight output lines of the exclusive OR circuit 21 are connected to the input terminals of each of the OR gates. In addition, there are forty output lines for the decoder 22 as shown in FIG. 5.

In FIG. 1, the error correction portion 23 is comprised of AND circuits 24~28, shift registers 29~33, and the exclusive OR circuit 34~38.

Each of the AND circuits 24~28 has eight 2-input AND gates. Each of the AND circuits 24~28 has a respective output line of the decoder 22 connected to one of the input terminals of the eight AND gates, and the supply line of the pulse signal P1 from the pulse generation circuit (not shown in the figure) is connected to the other input terminal of the AND gates.

The forty output lines of the decoder 22 are grouped into eights corresponding to H1~H5, and of these, the eight output lines relating to H1 are connected to the input side of the AND circuit 28, the eight output lines relating to H2 are connected to the input side of the AND circuit 27, the eight output lines relating to H3 are connected to the input side of the AND circuit 26, the eight output lines relating to H4 are connected to the input side of the AND circuit 25 and the eight output lines relating to H5 are connected to the input side of the AND circuit 24.

In addition, the pulse (H level) P1 supplied to each of the AND circuits 24~28 are all in synchronism, and is supplied synchronized to the timing $t_1$~$t_5$ described above, at intervals of $t_5$ ($t_0$, $t_5$, $t_{10}$, $t_{15}$, ...). However, the pulse P1 is not supplied at the same times, but at a timing which has a half-bit delay from the clock signals.

The shift registers 29~33 of the error correction portion 23 which has this configuration, store the cyclic signals H1~H5 which are input over the time $t_1$~$t_5$ of the series described above, and the shift register 33 stores H1, the shift register 32 stores H2, the shift register 31 stores H3, the shift register 30 stores H4 and the shift register 29 stores H5.

Accordingly, at time $t_5$ when the pulse P1 is supplied to the AND circuit 28, the AND circuit 28 outputs the syndrome of H1 which is included in the syndrome S, to the exclusive OR circuit 38. The exclusive OR circuit 38 performs a calculation of the exclusive OR of the syndrome of H1 and the H1 output from the shift register 33 and outputs the result of the calculation to the correction circuit (not shown in the figure). At this time, any 1-bit errors in the 7th bit of H1 are corrected by this error correction circuit and are output as corrected data H1.

In addition, the AND circuit 27 outputs the syndrome of H2 to the exclusive OR circuit 37. The exclusive OR circuit 37 calculates of the exclusive OR of the syndrome of H2, and the H2 output from the shift register 32, and outputs the result to the shift register 33.

In addition, the AND circuit 26 outputs the syndrome of H3 to the exclusive OR circuit 36. The exclusive OR circuit 36 calculates of the exclusive OR of the syndrome of H3, and the H3 output from the shift register 31, and outputs the result to the shift register 32.

In addition, the AND circuit 25 outputs the syndrome of H4 to the exclusive OR circuit 35. The exclusive OR circuit 35 performs a calculation of the exclusive OR of the syndrome of H4, and the H4 output from the shift register 30, and outputs the result to the shift register 31.

In addition, the AND circuit 24 outputs the syndrome of H5 to the exclusive OR circuit 34. The exclusive OR circuit 34 calculates for the exclusive OR of the syndrome of H5, and the H5 output from the shift register 29, and outputs the result to the shift register 30.

Each of the data H2~H5 for which such an exclusive OR calculation has been performed is corrected at that time, when there is an error such as that described above for H1.

After this, the corrected data H2' is output at the time $t_6$. The corrected data H3' is output at the time $t_7$. The corrected data H4' is output at the time $t_8$. The corrected data H5' is output at time $t_9$.

However, the 1-bit error correction circuit shown in FIG. 1 requires an error correction portion 23 which is comprised of the exclusive OR circuit 34~38 and AND circuit 24~28 which use eight 2-input AND gates and a decoder comprised of forty 8-input OR gates. Accordingly, the scale of the entire circuit of a conventional 1-bit error correction circuit becomes large and there is also the problem that the cost becomes high.

SUMMARY OF THE INVENTION

Accordingly, it is a general object of the present invention to provide a novel and useful syndrome generation method and CRC calculation method and a 1-bit error correction circuit based on CRC calculation wherein the foregoing problems are eliminated.

Another and more specific object of the present invention is to provide a syndrome generation method and CRC calculation method and a 1-bit error correction circuit based on CRC calculation, which has a small-scale circuit, and which can be provided at low cost.

Another object of the present invention is to provide a 1-bit error correction method based on CRC calculations, comprising a first step for conversion of n number of input data units of m number of bits, into parallel data and input of the parallel data to an exclusive OR circuit, a second step for inputting of data input to the exclusive OR circuit, to a first shift register, a third step for determining a first remainder of data input from the first shift register and on the basis of a predetermined first function, and for the output of the first remainder to the exclusive OR circuit, a fourth step for the conversion of m-bit input data input at a next timing, input to an exclusive OR circuit, determining an exclusive OR value of the input data and the first remainder determined by the third step, and input of the exclusive OR value to the first shift register, a fifth step of successively shifting at a predetermined timing, data input from the first shift register, in n number of second shift registers, a sixth step for generating a syndrome by repeating the steps from the first step to the fifth step until the multiplier n of the first sift register becomes a maximum degree, determining a second remainder using a predetermined second function and data output from the n-th second shift register, performing a calculation for the syndrome by an exclusive OR of the second remainder and the data output from the first shift register, a seventh step for synchronizing the syndrome and the input signals and detecting a 1-bit error in the parallel data, an eighth step for determining a third remainder using the first function when an output data of a predetermined second shift register is input, and determining actual data by performing a calculation for an exclusive OR of the third remainder and an output of a prior-stage shift register among the predetermined second registers, and a ninth step of performing correction of the 1-bit error data by performing calculation for an exclusive OR of the actual data determined in the eighth step, and 1-bit error data detected in the seventh step.

BRIEF DESCRIPTION OF THE DRAWINGS

FIG. 3 is a view describing the remainder output from a remainder calculation circuit;

FIG. 4 is a view describing the syndrome which is generated in the 1-bit error correction circuit of FIG. 1;

FIG. 7 is a view describing the syndrome in FIG. 6 of a first embodiment according to the present invention;

DETAILED DESCRIPTION OF THE PREFERRED EMBODIMENTS

Figure 1:
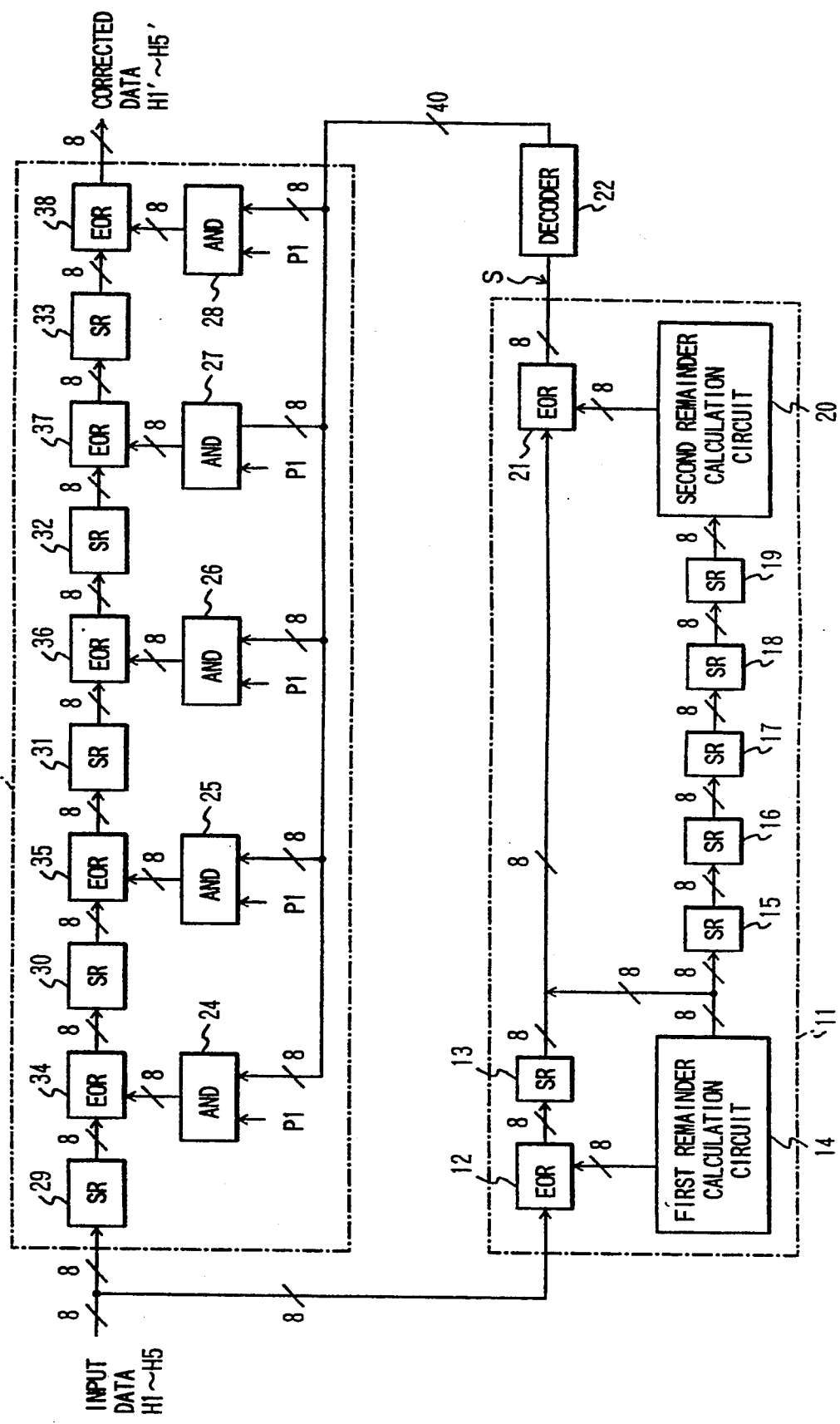
FIG. 1 is a view showing the constitution of a prior art of a 1-bit error correction circuit.
Figure 6:
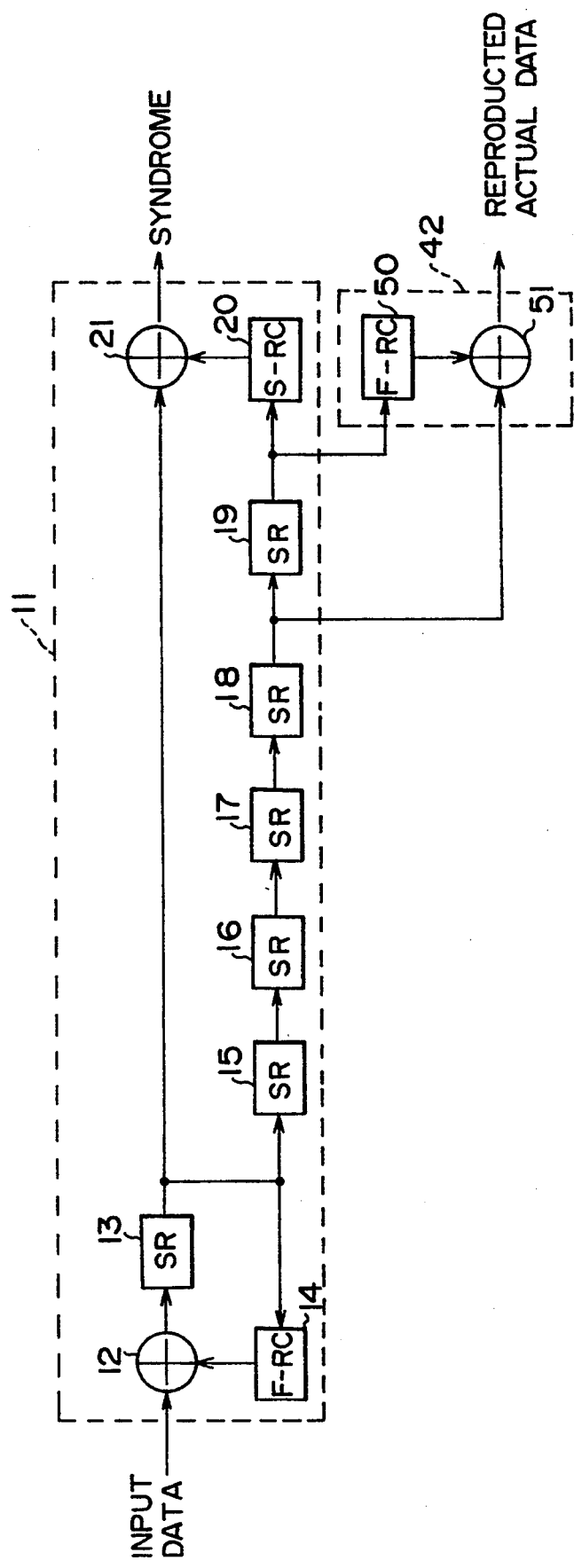
FIG. 6 is a non-specific data cancellation type of remainder generation circuit, and is an 8-bit parallel development of the first embodiment according to the present invention.

FIG. 6 is a non-specific data cancellation type remainder generation portion 11, and an 8-bit parallel development of the first embodiment according to the present invention. The syndrome generation circuit shown in FIG. 6 is comprised of the cancellation type syndrome generation portion 11 shown in FIG. 1, to which the exclusive OR circuit 51 and the first remainder calculation circuit 14 and a similar remainder calculation circuit 50 for the extraction of the actual data have been added to constitute the actual data reproduction portion 42. The syndrome generation portion 11 uses the function f(x) as the basis to determine the remainder of the parallel data H1~H5, for which H1 for example, is input to the first remainder calculation circuit 14 via the first exclusive OR circuit 12 and the shift register (SR) 13. Then, the exclusive OR circuit 12 performs a calculation of the exclusive OR of the remainder data output from the first remainder calculation circuit 14, and the parallel data H2 which is input as the next input data, and supplies the result to the shift register (SR) 13. The syndrome generation portion 11 performs cyclic of these actual data, and the remainder data determined by that cyclic is successively shifted to the shift registers 15~19 connected in series in accordance with the number 'n' of parallel data units H1~H5. The shifted remainder data is input to the second remainder calculation circuit 20. The second remainder calculation circuit 20 determines the remainder of the parallel data H1~H5 on the basis of the function "$f^n(x)$" which has the number 'n' of parallel data units H1~H5 as the multiplier. Then, the second remainder calculation circuit 20 outputs the remainder data to the exclusive OR circuit 21. The shift register (SR) 13 also outputs the remainder data to the exclusive OR circuit 21. Thus, the exclusive OR circuit 21 performs an exclusive OR of the two input remainder data unit, and outputs the syndrome S.

More specifically, in FIG. 6, if the function used by the first remainder calculation circuits 14 is f(x), the function used by the second remainder calculation circuit 20 is "$f^5(x)$", the input data is H1, and if "C" is the output of the shift register (SR) 13 at the time $t_0$, then the input of the shift register 19 at the time $t_5$ becomes H1 Ex f(C).

In addition, the actual data reproduction portion 42 added to the syndrome generation portion 11 has the output data of the shift register 19 of the syndrome generation portion 11 input to the first-remainder calculation circuit 50, and the exclusive OR circuit 51 performs the calculation of the exclusive OR of the data output from the shift register 18 and the remainder data output from the first remainder calculation circuit 50.

According to the configuration shown in FIG. 6, the exclusive OR circuit 21 of the syndrome generation portion 11 outputs the syndrome S, and the exclusive OR circuit 51 of the actual data reproduction portion 42 outputs the reproduced actual data from which non-specific elements f(C) have been excluded.

Figure 2A:
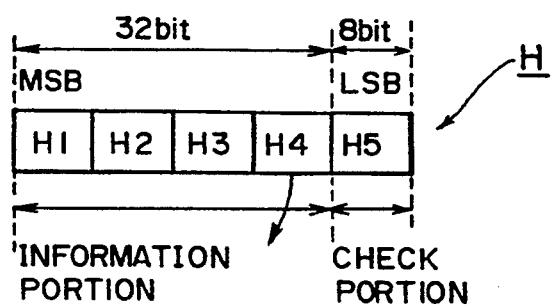
FIG. 2A, FIG. 2B and FIG. 2C are views describing a cyclic signal.
Figure 2B:
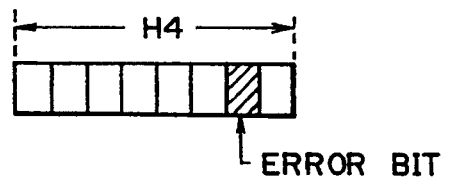
Figure 2C:
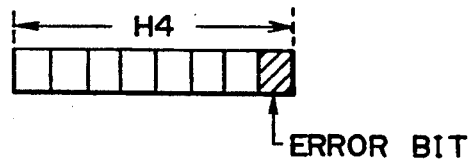

The description of the syndrome generation portion 11 shown in FIG. 6 will be given for the case when there is an error in the 8th bit of H4, for the input signals as shown in FIG. 2B.

When the function f(x) used in the remainder calculation for the syndrome S is expressed as the matrix α(x), then the function becomes as shown in ③ of FIG. 7, and equation ③' is obtained. Equation ④ is obtained when $α^3$ is multiplied to both sides of equation ③. The right side of equation ④ becomes the same as ②' shown in FIG. 4. This is to say that when there is an error in the 8th bit of H4, if a calculation is performed such that the syndrome S is input to the first remainder calculation circuit for three times over, the result is the same as the syndrome S for the case of an error in the 8'th bit of H1.

Figure 8:
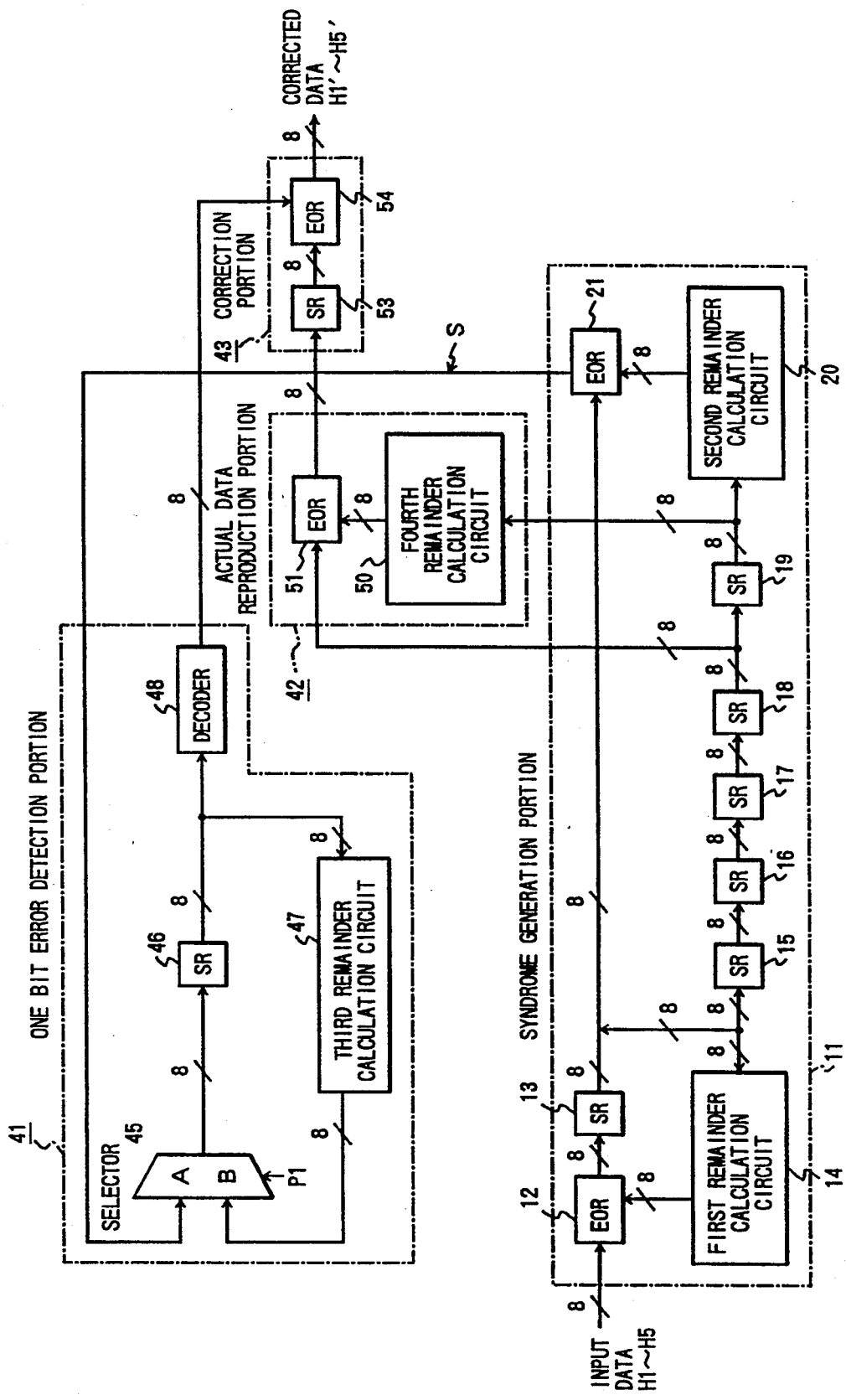
FIG. 8 is a view of the 1-bit error correction circuit using the circuit shown in FIG. 6 according to the present invention.

FIG. 8 shows a 1-bit error correction circuit using the syndrome generation portion 11 of FIG. 6. Those portions which are the same as corresponding portions of FIG. 6 are given the same numerals, and the corresponding descriptions of them are omitted.

The 1-bit error correction circuit shown in FIG. 8 is constituted from the 8-bit parallel development cancellation type syndrome generation portion 11 of FIG. 6, the 1-bit error detection portion 41, a actual data reproduction portion 42 and a correction portion 43.

The 1-bit error detection portion 41 comprises a selector 45 for selecting either the syndrome S output from the syndrome generation portion 11 or signals other than this, a shift register 46 which stores the signal selected by the selector 45, a third remainder calculation circuit 47 for determining the remainder of the signals output from the shift register 46, decoder 48 having an error pattern, for detecting the error.

When the pulse P1 is supplied from the timing generation portion 11 (not shown in the figure), the selector 45 selects the syndrome S which is supplied to the input terminal A of the selector 45, and outputs this to the shift register 46, and when the pulse P1 is not supplied, selects the remainder from the third remainder calculation circuit 47 which is supplied to the input terminal B and outputs this to the shift register 46. However, the pulse P1 is the same as that described earlier and is supplied at the timing $t_1 \sim t_5$ (at intervals of $t_5$ ($t_0$, $t_5$, $t_{10}$, $t_{15}$, ... )) with a half-bit delay from the clock signals.

The docoder 48 is comprised of eight OR gates of the 8-input type and which are provided with inverters of the input side, in accordance with the error pattern of H1.

The following will consider the case when the syndrome S is output from the 1-bit error correction circuit at the time $t_5$ and is supplied to the selector 45.

The syndrome S in this case is assumed to have a 1-bit error in the 8'th bit of H4. When the function f(x) used when there is remainder calculation is expressed as the matrix α(x), the syndrome S becomes as described above, the same as the syndrome S for an error in the 8'th bit of H1, and when the syndrome S for when there is an error in the 8'th bit of H4 is input the syndrome S for three times to the first remainder calculation circuit 14 and calculated.

Accordingly, with the syndrome S due to an error in H2~H5, the operation can be the same as for the syndrome S due to an error in H1. By this logic, as described above, the decoder 48 can be comprised using only eight OR gates of the 8-input type and provided with inverters to the input sides in accordance with the error patten of H1.

More specifically, at time $t_6$ when the pulse P1 is input to the selector 45, the syndrome S is selected for the case when there is a 1-bit error in the 7'th bit of H4 as described above, and supplied to the shift register 46. This syndrome S supplied to the shift register 46 is expressed by "H5Ex f(H4)Ex $f^2$ (H3)Ex $f^3$ (H2)Ex $f^4$ (H1)" as described above for the conventional example.

At the time $t_6$ when there is the supply of the clock signal (not shown in the figure), the "fH5Ex f(H4) Ex $f^2$ (H3)Ex $f^3$ (H2)Ex $f^4$ (H1)" is stored in the shift register 46 and input to the third remainder calculation circuit 47 and the decoder 48. Thus, the third remainder calculation circuit 47 outputs "f(H5)Ex $f^2$ (H4)Ex $f^3$ (H3)Ex $f^4$ (H2)Ex $f^5$ (H1)". At this time, the selector 45 selects "fH5Ex $f^2$ (H4)Ex $f^3$ (H3)Ex $f^4$ (H2)Ex $f^5$ (H1)" since it selects the data supplied to the input terminal B, and supplies this to the shift register 46.

At the time t, when the clock signal is supplied, the "fH5Ex $f^2$ (H4)Ex $f^3$ (H3)Ex $f^4$ (H2)Ex $f^5$ (H1)" is stored in the shift register 46 and is input to the third remainder calculation circuit 47 and the decoder 48, thus, "$f^2$H5Ex$f^3$ (H4)Ex $f^4$ (H3)Ex $f^5$ (H2)Ex $f^6$ (H1)" is output and this is supplied to the shift register 46 via the selector 45.

At time $t_5$ when the clock signal is supplied to the 1 bit error correction circuit, "$f^3$ H5Ex $f^3$ (H4)Ex $f^4$ (H3)

Ex $f^5$ (H2)Ex $f^6$ (H1)" is stored in the shift register 46, and input to the third remainder calculation circuit 47 and the decoder 48. Thus, "$f^3$H5Ex$f^4$ (H4)Ex $f^5$ (H3)Ex $f^6$ (H2)Ex $f^7$ (H1)" is output and supplied to the selector 45 and the shift register 46. This "$f^3$H5Ex$f^4$ (H4)Ex $f^5$ (H3)Ex $f^6$ (H2)Ex $f^7$ (H1)" is the same as when the $\alpha^3$ is multiplied to both sides of equation ③ shown in FIG. 7 and so it can be seen that the remainder is the same as that for when there is an error in the 8'th bit of H1.

At time $t_5$ when the clock signal is supplied to the 1-bit error correction circuit, "$f^3$H5Ex$f^4$ (H4)Ex $f^5$ (H3)Ex $f^6$ (H2)Ex $f^7$ (H1)" is stored in the shift register 46 and input to the third remainder calculation circuit 47 and decoder 48. Thus, 1-bit error detection data is output from the decoder 48.

The correction portion 43 is constituted from a shift register 53 and an exclusive OR circuit 54. The output data of the exclusive OR circuit 51 of the actual data reproduction portion 42 is stored in the shift register 53 and the exclusive OR of that stored data and the 1-bit error detection data output from the decoder 48 described above is calculated by the exclusive OR circuit 54 and output as corrected data.

At time $t_5$, the shift register 18 of the syndrome generation portion 11 stores "H4Ex f(H3)Ex $f^2$ (H2)Ex $f^3$ (H1)Ex $f^4$ (C)" and the shift register 19 stores "H3Ex f(H2)Ex $f^2$ (H1)Ex $f^3$ (C)". Accordingly, "H3Ex f(H2)Ex $f^2$ (H1)Ex $f^3$ (C)" is output from the shift register 18 and "H4Ex f(H3)Ex $f^2$ (H2)Ex $f^3$ (H1)Ex $f^4$ (C)" is output from the shift register 19 and input to the first remainder calculation circuit 50, while the "H4Ex f(H3)Ex $f^2$ (H2)Ex $f^3$ (H1)Ex $f^4$ (C)" is output from the shift register 19 and input to the exclusive OR circuit 51.

Furthermore, the first remainder calculation circuit 50 outputs the "f(H3)Ex $f^2$ (H2)Ex $f^3$ (H1)Ex $f^4$ (C)" and so the exclusive OR circuit 51 calculates of the exclusive OR of this "f(H3)Ex $f^2$ (H2)Ex $f^3$ (H1)Ex $f^4$ (C)" and "H4Ex f(H3)Ex $f^2$ (H2)Ex $f^3$ (H1)Ex $f^4$ (C)" and outputs the actual data H4.

At time $t_5$, the correction portion 43 stores the H4 from the actual data reproduction portion 42 in the shift register 53 and outputs the 1-bit error detection data from the decoder 48 of the 1-bit error detection portion 41. Here, the exclusive OR circuit 54 performs a calculation of the exclusive OR of the H4 from the shift register 53 and the 1-bit error detection data, and outputs the corrected data H4'. Accordingly, the correction portion 43 corrects the 1-bit error of H4.

Figure 5A:
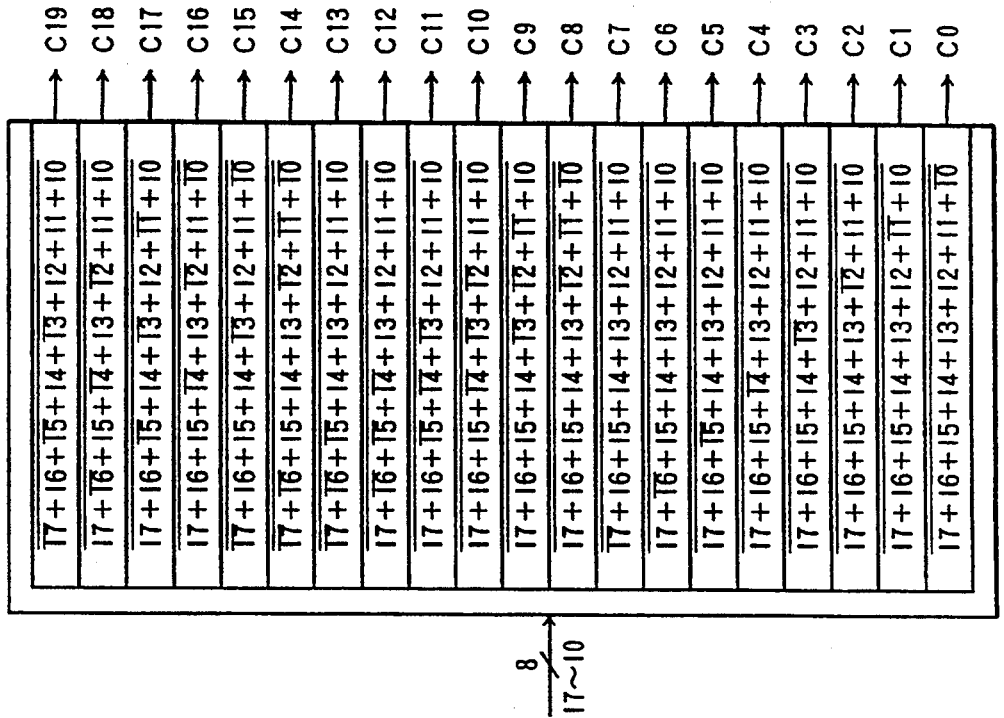
FIG. 5 is a view of the constitution of the decoder in FIG. 1.
Figure 5B:
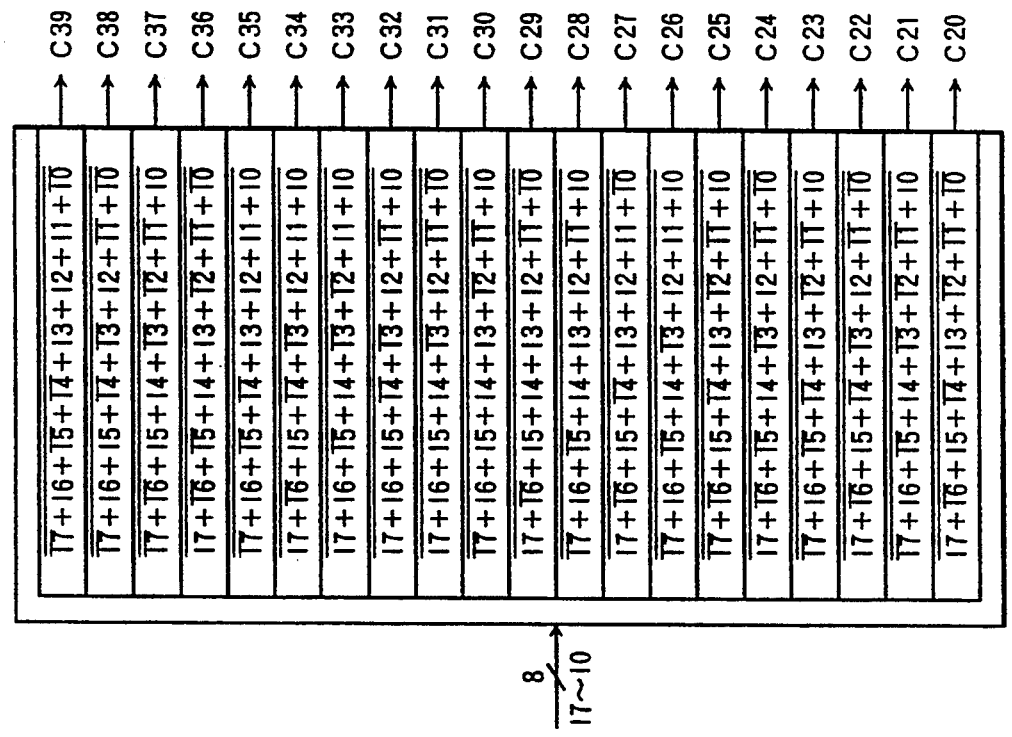
Figure 9:
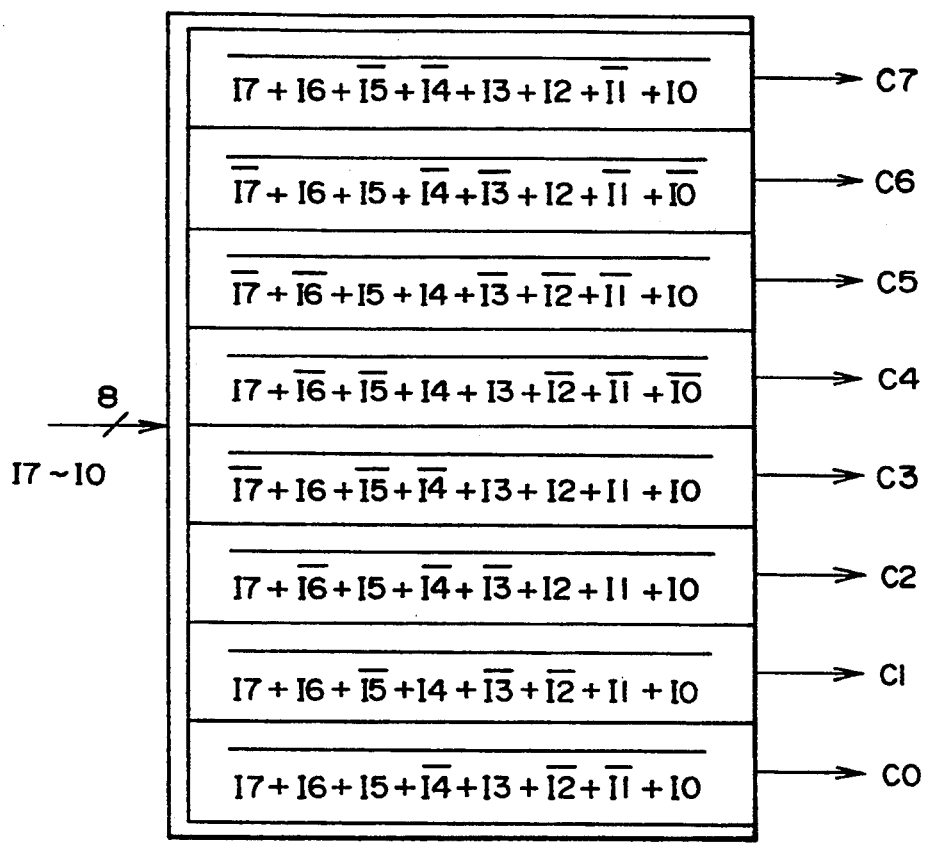
FIG. 9 is a view of the constitution of the decoder in FIG. 8.

FIG. 5 shows the configuration of a decoder suitable for a 1-bit error correction circuit based on conventional CRC calculations, while FIG. 9 shows the configuration of a decoder to which the present invention has been applied. The decoder of FIG. 5 requires 40 patterns of 40 bits but the decoder of FIG. 9 need only have eight patterns. In this manner, the structure is simplified for even one portion of the the circuit. Accordingly, when the entire circuit is considered, it is possible to greatly reduce the number of parts and at the same time lower the cost.

Figure 10:
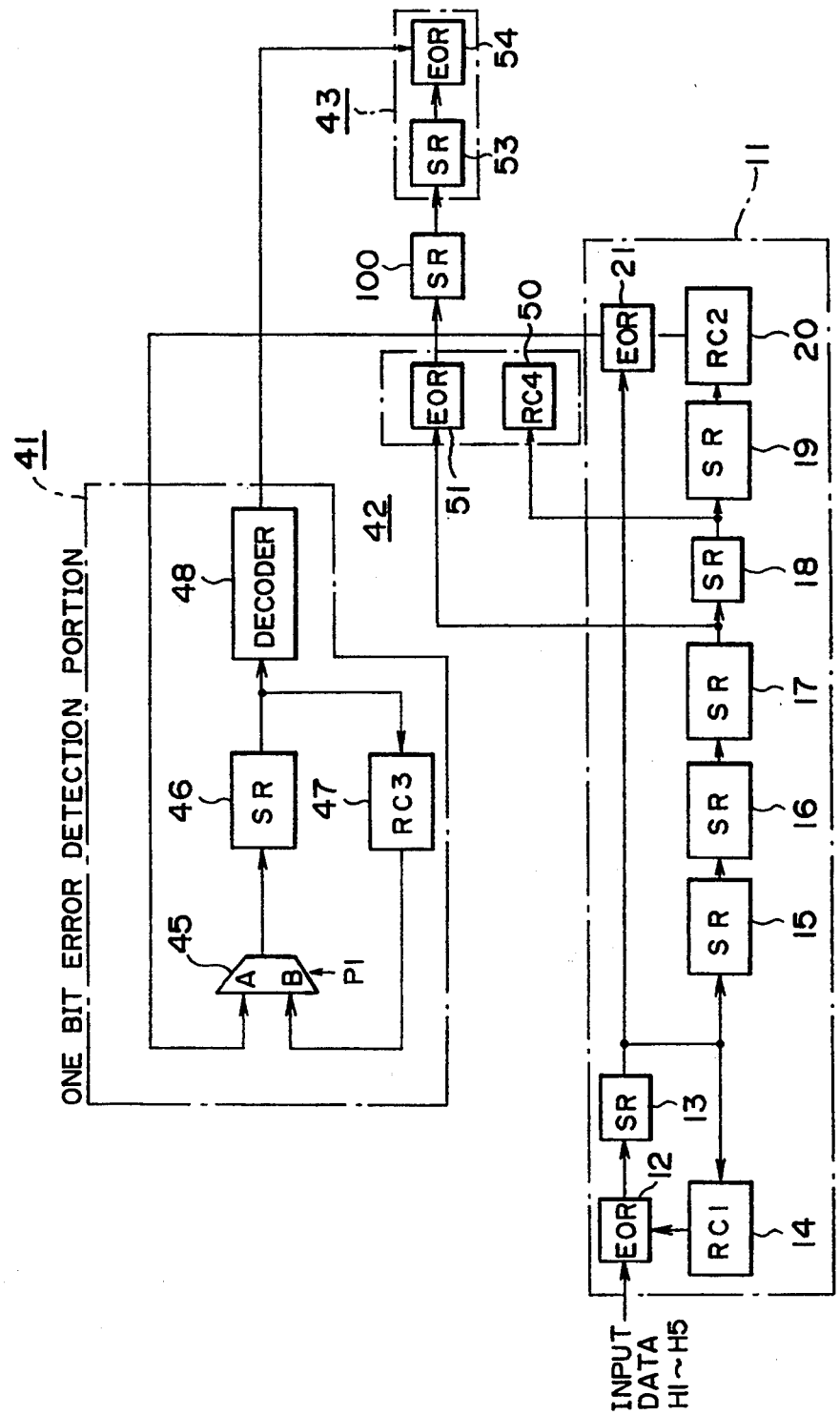
FIG. 10 is a non-specific data cancellation type of remainder generation portion, and is an 8-bit parallel development of the second embodiment according to the present invention.

FIG. 10 is a non-specific data cancellation type remainder generation portion 11, and is an 8-bit parallel development of the second embodiment according to the present invention.

The 1-bit error correction circuit of the second embodiment in FIG. 10 is provided with a register 100 which is connected between the actual data reproduction circuit 42 and the error correction portion 43. Output data from the register 18 is output to the first remainder calculation circuit 50 of the actual data reproduction circuit 42 and to the shift register 18, and output data from the register 17 is outputs to the exclusive OR circuit 51 of the actual data reproduction circuit 42 and to the shift register 18. The exclusive OR circuit 51 performs an exclusive OR of the output data of the first remainder calculation circuit 50 and the output data from the shift register 17, and outputs the result of the exclusive OR to the shift register 100. The 1-bit error correction circuit in FIG. 10 enables to take actual data without non-specification element f(C) as configuration of the first embodiment.

Figure 11:
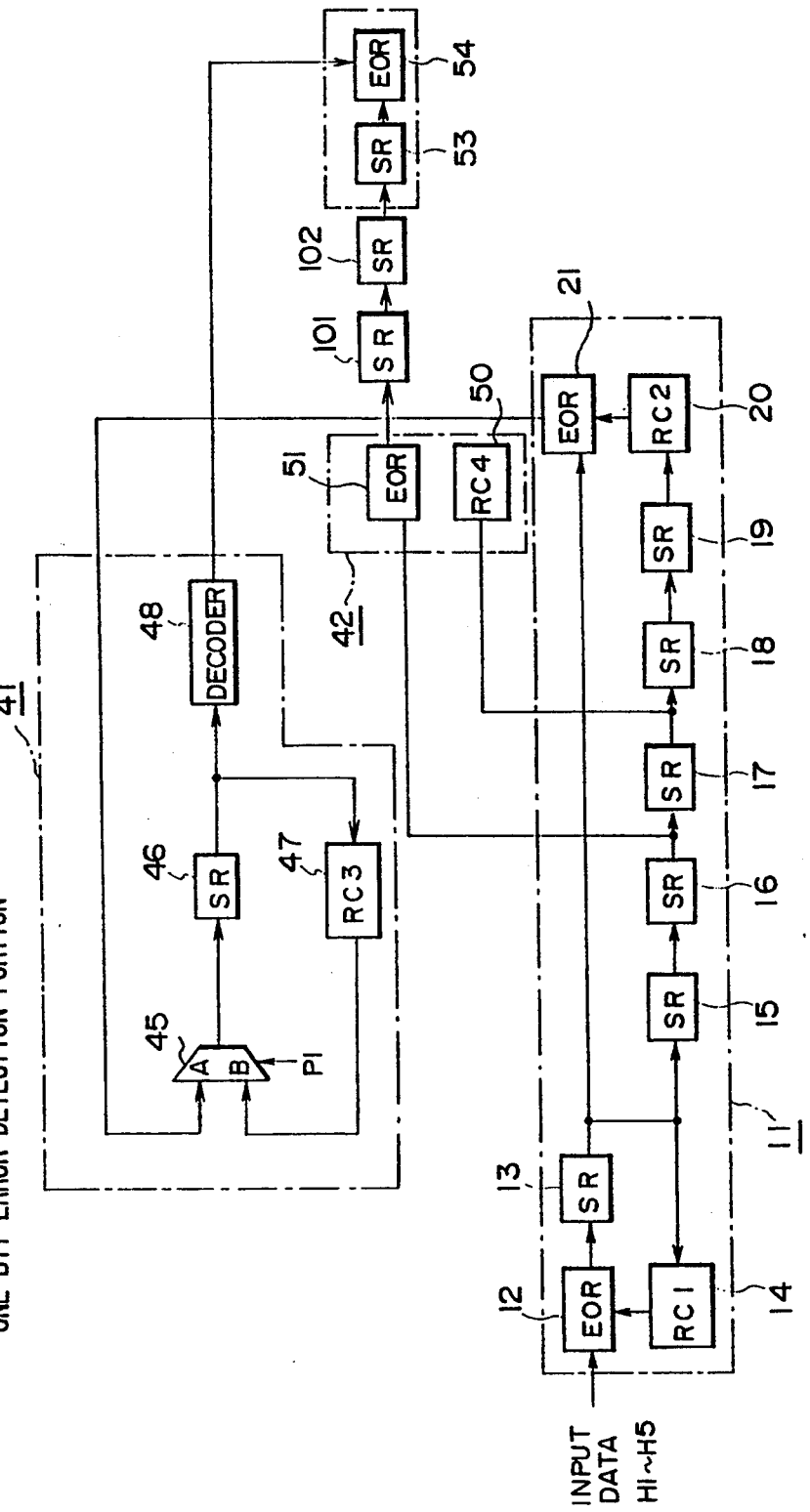
FIG. 11 is a non-specific data cancellation type of remainder generation portion, and is an 8-bit parallel development of the third embodiment according to the present invention.

FIG. 11 is a non-specific data cancellation type of remainder generation portion 11, and is an 8-bit parallel development of the third embodiment according to the present invention.

The 1-bit error correction circuit of the third embodiment in FIG. 11 is provided with registers 101 and 102 are connected between the actual data reproduction circuit 42 and the error correction portion 43. Output data from the register 17 is output to the first remainder calculation circuit 50 of the actual data reproduction circuit 42 and to the shift register 18, and output data from the register 16 is output to the exclusive OR circuit 51 of the actual data reproduction circuit 42 and to the shift register 17. The exclusive OR circuit 51 performs an exclusive OR of the output data of the first remainder calculation circuit 50 and the output data from the shift register 16 and outputs the result of the exclusive OR to the shift register 101. The shift register 101 stores the data from the exclusive OR circuit 51 and outputs it to the shift register 102. The 1-bit error correction circuit in FIG. 11 enables to take actual data without non-specific element f(C) as configuration of the first embodiment.

When the actual data reproducing, the output data of registers of the syndrome generation portion 11 have primary difference between a n'th register and a n+1'th register.

Generally, P number of registers connected in series and which use data input to the first remainder calculation circuit 50 of the actual data reproduction circuit, as output data of a register of an n-P stage to an n'th register for syndrome generation of the syndrome generation portion 11, and which function in the same manner as the first register 53 of the correction circuit when data input to a third exclusive OR circuit 51 of the actual data reproduction circuit is made data input to the n-P syndrome generation register in the syndrome generation portion 11.

Moreover, the present invention can also be applied to 1-bit error correction circuits based on serial processing type CRC calculations.

Further, the present invention is not limited to the embodiments described heretofore, and various variations and modifications maybe made without departing from the scope of the invention.

What is claimed is:

1. A 1-bit error correction method based on CRC calculations, comprising:
   a first step for conversion of n number of input data units of m number of bits, into parallel data and input of said parallel data to an exclusive OR circuit;
   a second step for inputting of data input to said exclusive OR circuit, to a first shift register;
   a third step for determining a first remainder of data input from said first shift register and on the basis of a predetermined first function, and for the output of said first remainder to said exclusive OR circuit;

a fourth step for the conversion of m-bit input data input at a next timing, input to an exclusive OR circuit, determining an exclusive OR value of said input data and said first remainder determined by said third step, and input of said exclusive OR value to said first shift register;

a fifth step of successfully shifting at a predetermined timing, data input from said first shift register, in n number of second shift registers;

a sixth step for generating a syndrome by repeating the steps from said first step to said fifth step until a multiplier n of said first shift register is incremented a maximum number of times, determining a second remainder using a predetermined second function and data output from said n-th second shift register, performing a calculation for said syndrome by an exclusive OR of said second remainder and the data output from said first shift register;

a seventh step for synchronizing said syndrome and said input signals of n number of data units and detecting a 1-bit error in said parallel data;

an eighth step for determining a third remainder using said first function when an output data of a predetermined second shift register is input, and determining actual data by performing a calculation for an exclusive OR of said third remainder and an output of a prior-stage shift register among said predetermined second registers, and a ninth step of performing correction of said 1-bit error data by performing calculation for an exclusive OR of said actual data determined in said eighth step, and 1-bit error data detected in said seventh step.

2. A 1-bit error correction method based on CRC calculations as claimed in claim 1, wherein said first function is f(x).

3. A 1-bit error correction method based on CRC calculations as claimed in claim 1, wherein said second function is a function $f^n(x)$ having the number of said parallel data units as the multiplier.

4. A 1-bit error correction method based on CRC calculations as claimed in claim 1, wherein said seventh step uses a function f(x) as the basis to determine a fourth remainder of input data, a selector selects said remainder when a pulse is supplied at a predetermined interval, and selects a fourth remainder of data output from a third shift register when said pulse is not supplied, a shift register holds and outputs either said selected remainder or said fourth remainder, and a decoder decodes and outputs all error patterns of said actual data having a highest order column, of said n number of m-bit actual data.

5. The 1-bit error correction method based on CRC calculations as claimed in claim 4, wherein said pulse is supplied at each clock cycle n to a number n of said actual data.

6. The 1-bit error correction method based on CRC calculations as claimed in claim 1, wherein said eight step calculates exclusive OR of said third-remainder and a output data of n-P (P<n) stage of said n-th second register.

* * * * *